United States Patent
Wang et al.

(10) Patent No.: US 11,302,755 B2
(45) Date of Patent: Apr. 12, 2022

(54) ARRAY SUBSTRATE, MANUFACTURING METHOD THEREOF, AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xinxin Wang, Beijing (CN); Chinlung Liao, Beijing (CN); Lifang Song, Beijing (CN); Yue Hu, Beijing (CN); Zhijie Ye, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 613 days.

(21) Appl. No.: 16/317,556

(22) PCT Filed: Jun. 12, 2018

(86) PCT No.: PCT/CN2018/090847
§ 371 (c)(1),
(2) Date: Jan. 13, 2019

(87) PCT Pub. No.: WO2019/080510
PCT Pub. Date: May 2, 2019

(65) Prior Publication Data
US 2021/0335928 A1 Oct. 28, 2021

(30) Foreign Application Priority Data
Oct. 23, 2017 (CN) .......................... 201710995702.1

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 51/5259* (2013.01); *H01L 51/56* (2013.01); *Y10S 977/773* (2013.01); *Y10S 977/814* (2013.01)

(58) Field of Classification Search
CPC ............. H01L 27/3246; H01L 27/3283; H01L 27/3295
See application file for complete search history.

(56) References Cited

U.S. PATENT DOCUMENTS 6,476,988 B1 * 11/2002 Yudasaka ............... G02B 5/201
359/885
7,015,503 B2 * 3/2006 Seki ....................... H05B 33/22
257/40
(Continued)

FOREIGN PATENT DOCUMENTS

CN 104538351 A * 4/2015 ....... H01L 21/02565
CN 105826358 A * 6/2016 ........... G09G 3/3208
(Continued)

OTHER PUBLICATIONS

Machine translation, Song, Chinese Pat. Pub. No. CN 107123752A, translation date: Aug. 8, 2021, Espacenet, all pages. (Year: 2021).*
(Continued)

*Primary Examiner* — Victoria K. Hall
(74) *Attorney, Agent, or Firm* — Syncoda LLC; Feng Ma

(57) ABSTRACT

A method for manufacturing an array substrate includes: forming a pixel defining layer having a plurality of accommodating wells over a substrate, and forming a hydrophobic material layer over the pixel defining layer. A side wall of each accommodating well comprises a hydrophilic side surface. The hydrophilic side surface is partially covered by (Continued)

the hydrophobic material layer to thereby form an overlapped region having a hydrophobic outer surface and an exposed region having a hydrophilic outer surface. The overlapped region is on a side of the exposed region distal to the substrate. The array substrate manufactured thereby allows an organic functional layer to be evenly fabricated in each accommodating well of the pixel defining layer via inkjet printing.

17 Claims, 5 Drawing Sheets

(56) References Cited

U.S. PATENT DOCUMENTS

| | | | | |
|---|---|---|---|---|
| 7,214,959 B2* | 5/2007 | Seki | ............ | H01L 27/3246 257/40 |
| 7,273,801 B2* | 9/2007 | Seki | ............ | H01L 27/322 438/584 |
| 7,442,955 B2* | 10/2008 | Seki | ............ | H01L 27/3246 257/40 |
| 7,754,275 B2* | 7/2010 | Mitsuhashi | ............ | H01L 27/3246 427/66 |
| 7,932,518 B2* | 4/2011 | Seki | ............ | H01L 51/0005 257/59 |
| 8,569,763 B2* | 10/2013 | Nendai | ............ | H01L 51/5209 257/59 |
| 9,972,665 B2* | 5/2018 | Wang | ............ | H01L 27/3283 |
| 10,541,285 B2* | 1/2020 | Wang | ............ | H01L 27/3246 |
| 10,770,523 B2* | 9/2020 | Kim | ............ | H01L 27/3246 |
| 10,770,526 B2* | 9/2020 | Kim | ............ | H01L 27/3246 |
| 2005/0186403 A1* | 8/2005 | Seki | ............ | H01L 27/3246 428/195.1 |
| 2007/0269621 A1* | 11/2007 | Mitsuhashi | ............ | H01L 51/0003 428/34.1 |
| 2010/0289728 A1* | 11/2010 | Nakatani | ............ | H01L 27/3246 345/76 |
| 2012/0319089 A1* | 12/2012 | Shin | ............ | H01L 51/0017 257/40 |
| 2014/0139102 A1* | 5/2014 | Jeon | ............ | H01L 27/326 313/504 |
| 2014/0354139 A1* | 12/2014 | Yoon | ............ | H01L 51/0005 313/498 |
| 2015/0001473 A1* | 1/2015 | Ahn | ............ | H01L 51/5203 257/40 |
| 2015/0333110 A1* | 11/2015 | Park | ............ | H01L 27/3248 257/40 |
| 2016/0071913 A1* | 3/2016 | Kim | ............ | H01L 51/0004 257/40 |
| 2016/0111688 A1* | 4/2016 | Lee | ............ | H01L 27/3246 257/40 |
| 2017/0104042 A1* | 4/2017 | Wang | ............ | H01L 27/3283 |
| 2017/0133443 A1* | 5/2017 | Nendai | ............ | H01L 51/5206 |
| 2017/0186828 A1* | 6/2017 | Hsin | ............ | H01L 51/0003 |
| 2018/0090682 A1* | 3/2018 | Shi | ............ | H01L 27/3283 |
| 2018/0138411 A1* | 5/2018 | Hung | ............ | H01L 27/3246 |
| 2018/0190737 A1* | 7/2018 | Yang | ............ | H01L 51/56 |
| 2018/0205026 A1* | 7/2018 | Zhou | ............ | H01L 51/5206 |
| 2019/0058019 A1* | 2/2019 | Hu | ............ | H01L 51/56 |
| 2019/0088892 A1* | 3/2019 | Zhang | ............ | H01L 51/0005 |
| 2019/0123116 A1* | 4/2019 | Wang | ............ | H01L 27/3283 |
| 2019/0148468 A1* | 5/2019 | Jia | ............ | H01L 27/3246 257/40 |
| 2019/0181195 A1* | 6/2019 | Wang | ............ | H01L 27/3283 |
| 2019/0229162 A1* | 7/2019 | Shin | ............ | H01L 51/0012 |
| 2019/0333974 A1* | 10/2019 | Jiang | ............ | H01L 27/3283 |
| 2020/0013836 A1* | 1/2020 | Li | ............ | H01L 51/5284 |
| 2020/0303686 A1* | 9/2020 | Zhao | ............ | H01L 27/3246 |
| 2021/0288295 A1* | 9/2021 | Song | ............ | H01L 51/56 |
| 2021/0305331 A1* | 9/2021 | Yu | ............ | H01L 51/56 |
| 2021/0343804 A1* | 11/2021 | Hsu | ............ | H01L 51/56 |

FOREIGN PATENT DOCUMENTS

| | | | | |
|---|---|---|---|---|
| CN | 105826358 A | | 8/2016 | |
| CN | 107123752 A | * | 9/2017 | ......... H01L 27/3246 |
| CN | 107123752 A | | 9/2017 | |
| CN | 207250517 U | * | 4/2018 | ............. H01L 21/77 |
| WO | 2015152085 A1 | | 10/2015 | |
| WO | WO-2015152085 A1 | * | 10/2015 | ............. H05B 33/12 |
| WO | WO 2016165233 A1 | * | 10/2016 | ............. H01L 51/56 |

OTHER PUBLICATIONS

Machine translation, Wang, Chinese Pat. Pub. No. CN 105826358A, translation date: Aug. 8, 2021, Espacenet, all pages. (Year: 2021).*
Machine translation, Wang, Chinese Pat. Pub. No. CN 207250517U, translation date: Aug. 8, 2021, Espacenet, all pages. (Year: 2021).*
Machine translation, Kurata, WIPO Pat. Pub. No. 2015152085A1, translation date: Dec. 1, 2021, Espacenet, all pages. (Year: 2021).*
International Search Report and Written Opinion dated Sep. 12, 2018 in PCT/CN2018/090847.
Extended European Search Report in Application No. EP18833589, dated Jul. 1, 2021.

* cited by examiner

ARRAY SUBSTRATE, MANUFACTURING METHOD THEREOF, AND DISPLAY APPARATUS

CROSS-REFERENCE TO RELATED APPLICATIONS

The present application is a national stage of International Application No. PCT/CN2018/090847 filed on Jun. 12, 2018, which claims priority to Chinese Patent Application No. CN 201710995702.1 filed on Oct. 23, 2017. The disclosures of the above-referenced applications are hereby incorporated by reference in their entirety.

TECHNICAL FIELD

The present disclosure relates generally to the field of display technology, and more specifically to a method for manufacturing an array substrate, an array substrate manufactured thereby, and a display apparatus containing the array substrate.

BACKGROUND

Organic light-emitting diode (OLED) is a type of organic thin film electroluminescent component, it has the advantages such as simple manufacturing process, low cost, high luminous efficiency, and capability of forming flexible structures easily. As a result, the display technology utilizing organic light-emitting diode (OLED) has become an important display technology.

At present, there are two methods for forming an OLED film. One method is a deposition process, which is most suitable for the manufacturing of small-sized OLED. Currently, this first method has entered the stage of mass production.

Another method is a solution process, which mainly employs an organic solution that has been prepared to form a film through approaches such as spin coating, inkjet printing, or screen printing. This second method has the advantages such as low cost, high production capacity, and suitability for large-sized panels, and as such has been widely researched domestically and internationally. Among these above approaches for manufacturing OLED films via the solution process, the inkjet printing technology can be employed as a promising approach for the mass production of large-sized OLED panels because of its relatively high material utilization rate.

SUMMARY

In a first aspect, a method for manufacturing an array substrate is disclosed. The method comprises the following steps:

forming a pixel defining layer having a plurality of accommodating wells over a substrate, wherein a side wall of each of the plurality of accommodating wells comprises a hydrophilic side surface; and forming a hydrophobic material layer over the pixel defining layer, such that the hydrophilic side surface is partially covered by the hydrophobic material layer to thereby form an overlapped region having a hydrophobic outer surface and an exposed region having a hydrophilic outer surface, wherein the overlapped region is on a side of the exposed region distal to the substrate.

According to some embodiments of the method, the step of forming a pixel defining layer having a plurality of accommodating wells over a substrate comprises the following sub-steps:

forming a hydrophilic material layer over the substrate; and performing a patterning process over the hydrophilic material layer to thereby form the pixel defining layer having the plurality of accommodating wells.

According to some other embodiments of the method, the step of forming a pixel defining layer having a plurality of accommodating wells over a substrate comprises: the following sub-steps:

providing a mixture of a hydrophilic material and a hydrophobic material;

forming the mixture over the substrate;

drying the mixture to thereby form a hydrophilic material sub-layer and a hydrophobic material sub-layer, wherein the hydrophobic material sub-layer is at a side of the hydrophilic material sub-layer distal to the substrate; and performing a patterning process to form the plurality of accommodating wells in the hydrophilic material sub-layer and the hydrophobic material sub-layer to thereby expose the hydrophilic side surface on the side wall of the each of the plurality of accommodating wells.

In the embodiments of the method described above, in the step of forming a hydrophobic material layer over the pixel defining layer, a first distance of a lower edge of the hydrophobic material layer to a bottom surface of the each of the plurality of accommodating wells is smaller than a second distance of a bottom surface of the hydrophobic material sub-layer to the bottom surface of the each of the plurality of accommodating wells.

According to some embodiments of the method, the step of forming a hydrophobic material layer over the pixel defining layer comprises:

contacting the pixel defining layer with a hydrophobic material solution, such that a side thereof having openings of the plurality of accommodating wells is submerged in the hydrophobic material solution; and forming a layer of hydrophobic nanospheres in the hydrophobic material solution via self-assembly to thereby form the hydrophobic material layer over the pixel defining layer.

Herein the hydrophobic material solution comprises at least one of polysiloxane or tetrafluoroethylene.

According to some other embodiments of the method, the step of forming a hydrophobic material layer over the pixel defining layer comprises:

forming a plurality of Si nanoparticles over the pixel defining layer; and allowing the plurality of Si nanoparticles to grow into a layer of hydrophobic nanowires by introducing a gas to thereby form the hydrophobic material layer over the pixel defining layer.

In the method disclosed herein, after the step of forming a hydrophobic material layer over the pixel defining layer, the method further includes a step of:

forming a plurality of organic functional layers inside each of the plurality of accommodating wells.

Herein at least one of the plurality of organic functional layers can be formed via a solution process. The solution process can comprise inkjet printing.

In a second aspect, the disclosure further provides an array substrate.

The array substrate comprises a substrate, a pixel defining layer having a plurality of accommodating wells over the substrate, and a hydrophobic material layer over the pixel defining layer. A side wall of each of the plurality of accommodating wells comprises a hydrophilic side surface, wherein the hydrophilic side surface is partially covered by the hydrophobic material layer to thereby form an overlapped region having a hydrophobic outer surface and an exposed region having a hydrophilic outer surface, wherein the overlapped region is at a side of the exposed region distal to the substrate.

In the array substrate, the pixel defining layer can include a hydrophilic material sub-layer and a hydrophobic material sub-layer. The hydrophobic material sub-layer is at a side of the hydrophilic material sub-layer distal to the substrate, and the hydrophilic material sub-layer is exposed in each of the plurality of accommodating wells to thereby form the hydrophilic side surface in the side wall of the each of the plurality of accommodating wells.

In the array substrate described above, a first distance of a lower edge of the hydrophobic material layer to a bottom surface of the each of the plurality of accommodating wells is about 5%-80% of a thickness of the hydrophilic material sub-layer.

Further in the array substrate described above, the hydrophilic material sub-layer comprises at least one of a polyimide, a bisphenol A polycarbonate, a polymer whose backbone chain contains an alkyl group, or a polymer whose backbone chain contains an annular rigid structure.

In addition, the hydrophobic material sub-layer can include at least one of polysiloxane, fluorine-containing polyolefin, or fluorine-containing polyalkyleneoxide.

According to some embodiments of the array substrate, the hydrophobic material layer comprises a layer of hydrophobic nanospheres. Each of the hydrophobic nanospheres can have a size of about 20-100 nm, and every two neighboring nanospheres can have a distance of about 1-20 nm therebetween.

According to some other embodiments of the array substrate, the hydrophobic material layer comprises a layer of hydrophobic nanowires.

The array substrate can further comprise a plurality of organic functional layers disposed inside each of the plurality of accommodating wells.

In a third aspect, the disclosure further provides a display apparatus.

The display apparatus contains an array substrate according to any one of the embodiments as described above.

BRIEF DESCRIPTION OF DRAWINGS

In order to clearly illustrate various embodiments in the invention disclosed herein, the following are accompanying drawings in the description of the embodiments, which are introduced briefly herein.

It is noted that these drawings shall be regarded to represent only some, but not all, of the embodiments of the present disclosure. For those skilled in the art, other embodiments may become apparent based on the structures as illustrated in these accompanying drawings.

Combined with embodiments, the achievement of objects, the functional characteristics and the advantages of the present disclosure will be further described in detail with reference to the accompanying drawings.

DETAILED DESCRIPTION

Various embodiments of the present disclosure are described below with specific examples, and other advantages and effects of the present disclosure can be easily understood by those skilled in the field of technology from the contents disclosed in this specification.

Apparently, the described embodiments are only a part of embodiments in the present disclosure, rather than all of them. The present disclosure can also be implemented or applied through different specific embodiments, and various details of the specification can also be modified or changed based on different viewpoints and applications without departing from the spirit of the present disclosure.

Based on the embodiments in the present disclosure, all the other embodiments acquired by those skilled in the art on the premise of not paying creative labor are in the protection scope of the present disclosure. It should be noted that, on the premise that there is no conflict, the following embodiments and the features in the embodiments can be combined together.

In existing inkjet printing technologies for manufacturing an OLED film in an OLED display panel, because a pixel defining layer (PDL) typically has a hydrophobic top and hydrophilic sides, during a drying process, the ink drops can climb along an edge of the PDL, thereby forming an uneven film that is thick at the edge and is thin in the middle. This often negatively affects the photochromic effect or the light-emitting effect of the emitting layer (EL) and influences a working life of the display component.

In light of this above issues associated with the existing manufacturing process of an array substrate, the present disclosure provides a method for manufacturing an array substrate, an array substrate manufactured thereby, and a display apparatus containing the array substrate.

In a first aspect, a method for manufacturing an array substrate (i.e. an array substrate manufacturing method) is disclosed herein.

The array substrate manufacturing method comprises the steps of:

S1: forming a pixel defining layer having a plurality of accommodating wells over a substrate, wherein a side wall of each of the plurality of accommodating wells comprises a hydrophilic side surface; and S2: forming a hydrophobic material layer over the pixel defining layer, such that the hydrophilic side surface is partially covered by the hydrophobic material layer to thereby form an overlapped region having a hydrophobic outer surface and an exposed region having a hydrophilic outer surface, wherein the overlapped region is on a side of the exposed region distal to the substrate.

Figure 1:
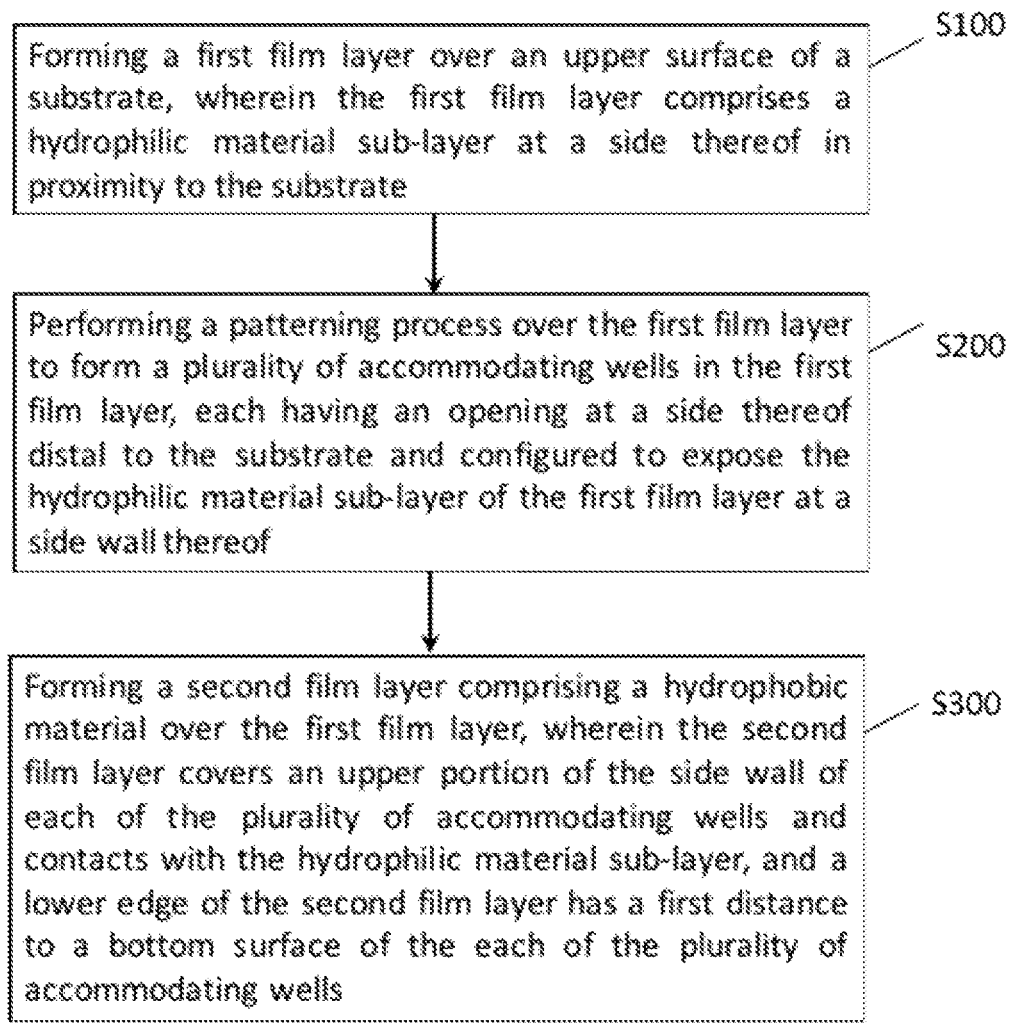
FIG. 1 is a flow chart of a method for manufacturing an array substrate according to some embodiments of the disclosure.

FIG. 1 illustrates a flow chart of the array substrate manufacturing method according to some embodiments of the disclosure. As specifically illustrated in FIG. 1, the embodiments of the method substantially comprises the following steps:

S100: Forming a first film layer 1 over an upper surface of a substrate 10, wherein the first film layer 1 comprises a hydrophilic material sub-layer 11 at a side thereof in proximity to the substrate 10;

S200: Performing a patterning process over the first film layer 1 to form a plurality of accommodating wells 13 in the first film layer 1, each having an opening at a side thereof distal to the substrate 10 and configured to expose the hydrophilic material sub-layer 11 of the first film layer 1 at a side wall thereof; and S300: Forming a second film layer 2 comprising a hydrophobic material over the first film layer 1, wherein the second film layer 2 covers an upper portion of the side wall of each of the plurality of accommodating wells 13 and contacts with the hydrophilic material sub-layer 11, and a lower edge of the second film layer 2 has a first distance to a bottom surface of the each of the plurality of accommodating wells 13.

Through the manufacturing method as described above, a pixel defining layer having a plurality of accommodating wells is first formed over the substrate through S100 and S200, and a side wall of each of the plurality of accommodating wells is configured to comprise a hydrophilic side surface, due to the exposure of the hydrophilic material sub-layer 11 of the first film layer 1 at a side wall thereof.

Subsequently, a second film layer 2 comprising a hydrophobic material, which is substantially the hydrophobic material layer, is arranged at the side wall of each accommodating well 13 of the pixel defining layer. The upper portion of the side wall is thus covered by the second film layer 2 to thereby form the overlapped region having a hydrophobic outer surface. A lower portion of the side wall is thus an exposed region having a hydrophilic outer surface.

As a result, in the array substrate manufactured thereby, the side wall of each accommodating well 13 has both the hydrophilic characteristics on the exposed region and the hydrophobic characteristics on the overlapped region, which is beneficial for the subsequent formation of other materials/layers, such as the organic functional layer, inside each accommodating well 13 during subsequent manufacturing processes of the array substrate.

Herein, the first distance can be arranged to be about 5%-80% of, and preferably about 10%-60% of, a thickness of the hydrophilic material sub-layer 11. Further preferably, the first distance can be for example, 10%, 15%, or 20%, etc., of the thickness of the hydrophilic material sub-layer 11. As such, it is beneficial for arranging an organic functional layer having a different thickness within each accommodating well 13.

Specifically, in the array substrate manufactured by these above embodiments of the array substrate manufacturing method, a second film layer 2 comprising a hydrophobic material is formed such that it covers at least a portion of the side wall of each accommodating well 13 to contact with the hydrophilic material sub-layer 11 in the first film layer 1 to thereby form an overlapped region having a hydrophobic outer surface. In addition, at least a portion of the side wall of each accommodating well 13 is not covered by the second film layer 2 and is thus still exposed to form an exposed region having a hydrophilic outer surface.

Therefore, when forming an organic functional layer inside each accommodating well 13 via inkjet printing, although the hydrophilic material in the first film layer 1 (i.e. the hydrophilic material sub-layer 11 exposed to a side wall of each accommodating well 13) has an attractive force to the organic functional layer being fabricated, the hydrophobic material in the second film layer 2 which covers an upper portion of the side wall of, and has a first distance to a bottom surface of, each accommodating wells 13, has a repulsive force to the organic functional layer being fabricated at the same time.

Under the influence of these two forces, the uniformity of the organic functional layer being fabricated via inkjet printing can thus be improved, and further as a result, the photochromic effect and/or the light-emitting effect of the organic functional layer, and the working life of the electronic components as well, can also be improved.

Herein the hydrophilic material sub-layer 11 can have a composition of a photoresist, and can specifically comprise at least one of a polyimide, a bisphenol A polycarbonate, a polymer whose backbone chain contains an alkyl group, or a polymer whose backbone chain contains an annular rigid structure. Other material may also be employed.

In the following, three specific embodiments of the manufacturing method of the array substrate are provide for further illustration.

Figure 2:
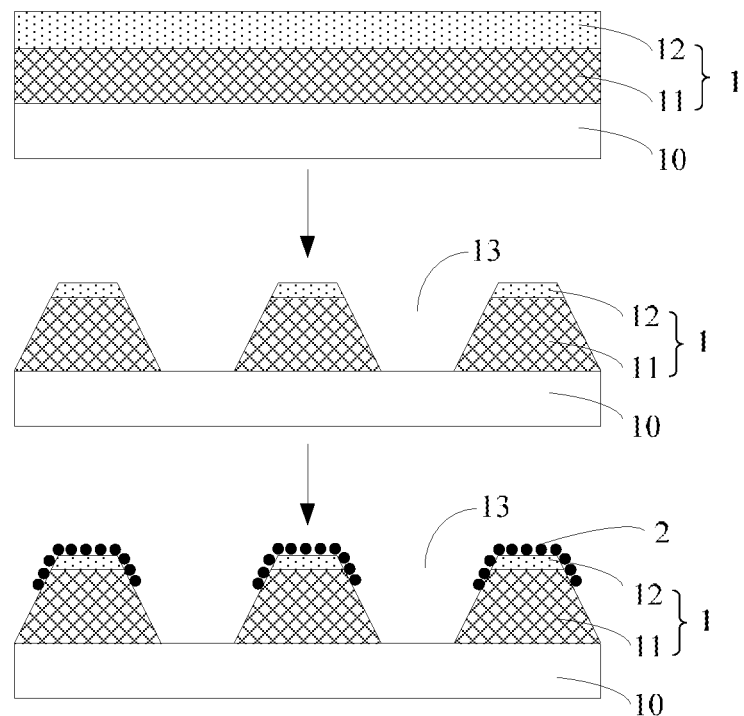
FIG. 2 illustrates a schematic diagram of the array substrate being manufactured after each step in the method as shown in FIG. 1.
Figure 3:
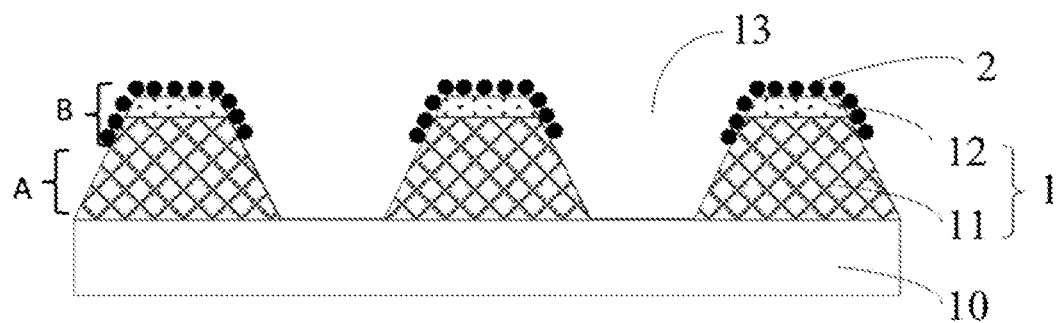
FIG. 3 is a schematic diagram illustrating a structure of the array substrate manufactured by the method shown in FIG. 1.
Figure 4:
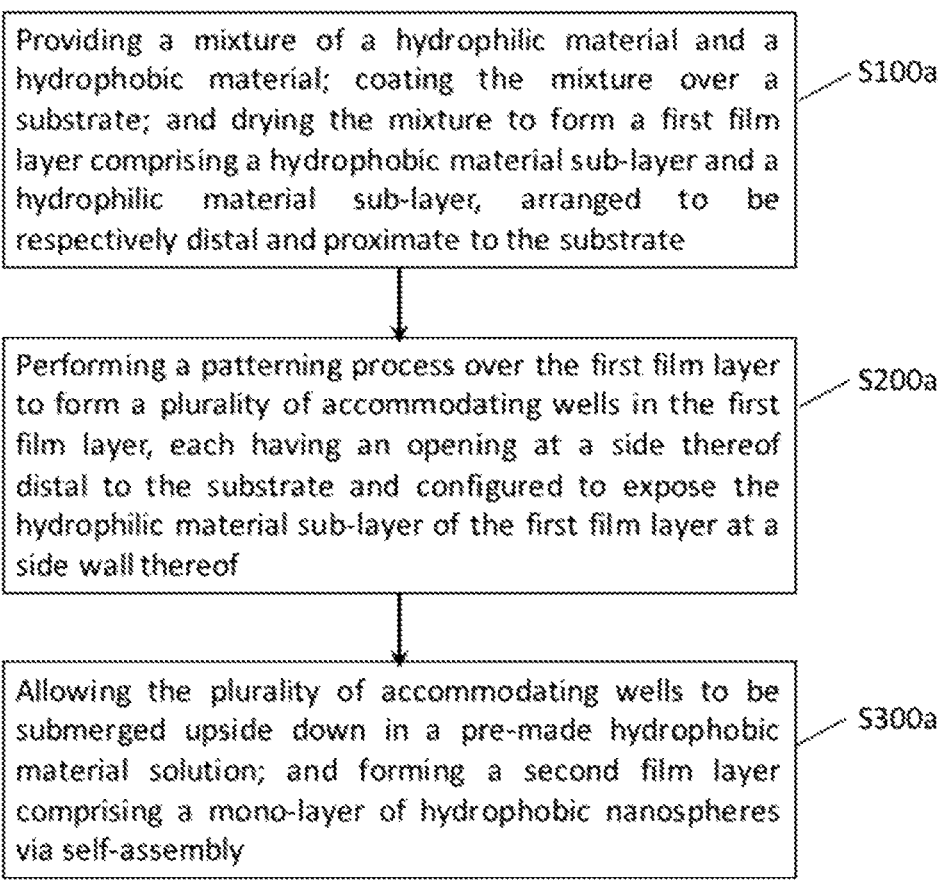
FIG. 4 is a flow chart of a method for manufacturing an array substrate according to one embodiment of the present disclosure.

As illustrated in FIG. 2 and FIG. 3, according to one embodiment, the array substrate manufacturing method comprises the following steps S100a, S200a, and S300a, as illustrated by the flow chart shown in FIG. 4:

S100a: Providing a mixture of a hydrophilic material and a hydrophobic material; coating the mixture over a substrate 10; and drying the mixture to form a first film layer 1 comprising a hydrophobic material sub-layer 12 and a hydrophilic material sub-layer 11, arranged to be respectively distal and proximate to the substrate 10.

Herein, the hydrophilic material sub-layer 11 preferably comprises a photoresist (e.g. polyimide), and the hydrophobic material sub-layer comprises a fluorine-containing material with a low surface energy such as tetrafluoroethylene or teflon.

S200a: Performing a patterning process over the first film layer 1 to form a plurality of accommodating wells 13 in the first film layer 1, each having an opening at a side thereof distal to the substrate 10 and configured to expose the hydrophilic material sub-layer 11 of the first film layer 1 at a side wall thereof.

Herein, the plurality of accommodating wells 13 in the first film layer 1 can be utilized for arranging an organic functional layer thereinside in a subsequent manufacturing process of the array substrate.

S300a: Allowing the plurality of accommodating wells 13 to be submerged upside down in a pre-made hydrophobic material solution; and forming a second film layer 2 comprising a mono-layer of hydrophobic nanospheres via self-assembly.

Each of the hydrophobic nanospheres has a size (i.e. diameter) of about 20-100 nm, and every two neighboring nanospheres have a distance (i.e. a distance between two spherical centers) of about 1-20 nm therebetween.

The second film layer 2 is configured to cover the hydrophobic material sub-layer 12 and at least an upper portion of the side wall of each of the plurality of accommodating wells 13, to thereby contact with the hydrophilic material sub-layer 11 (in other words, it is configured such that a first distance of a lower edge of the second film layer 2 to a bottom surface of each of the plurality of accommodating wells 13 is smaller than a second distance of a bottom surface of the hydrophobic material sub-layer 12 to the bottom surface of each of the plurality of accommodating wells 13).

As such, an overlapped region B is substantially formed in the side wall of each accommodating well 13, due to the covering of the second film layer 2 thereon, whereas an exposed region A is also present in the side wall of each accommodating well 13, due to the fact that the second film layer 2 is not covered thereon, and the hydrophilic material sub-layer 11 is exposed in this exposed region A. Thereby, in the side wall of each accommodating well 13, the overlapped region B has a hydrophobic outer surface, whereas the exposed region A has a hydrophilic outer surface, as illustrated in FIG. 3.

By such a configuration, the hydrophilic outer surface has an attractive force to the organic functional layer to be formed, and the hydrophobic nanospheres in the second film layer 2 in the hydrophobic outer surface have a repulsive force to the organic functional layer to be formed. Under the influence of these two forces, the uniformity of the organic functional layer can thus be improved, and further as a result, the photochromic effect and/or the light-emitting effect of the organic functional layer, and the working life of the electronic components as well, can also be improved.

Figure 5:
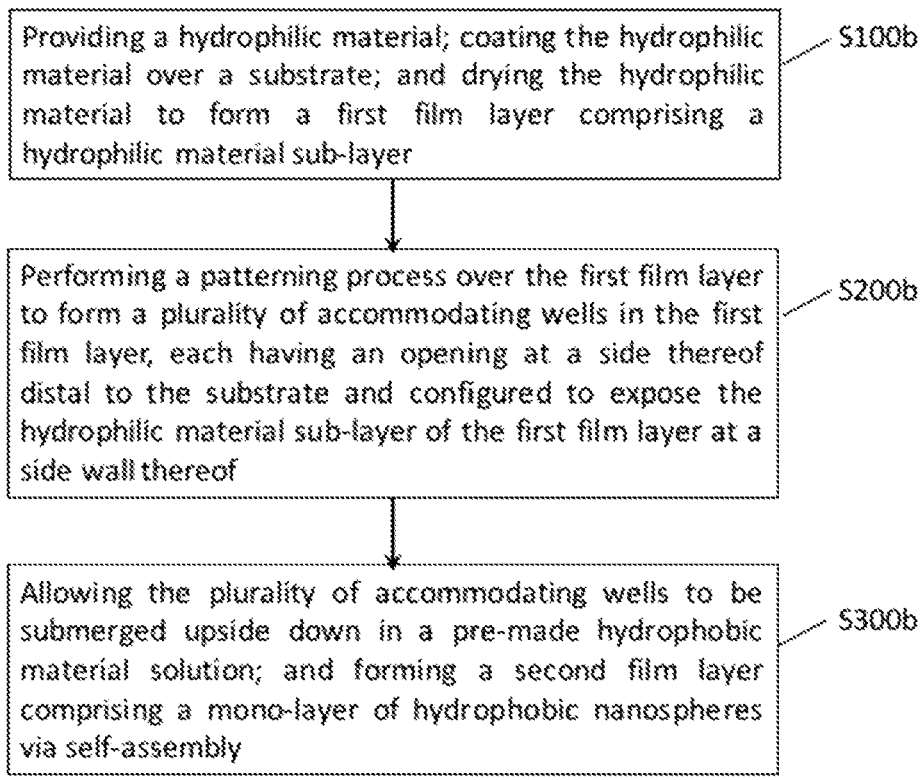
FIG. 5 is a flow chart of a method for manufacturing an array substrate according to a another embodiment of the present disclosure.

According to another embodiment, the manufacturing method includes three steps S100b, S200b, and S300b, as illustrated by the flow chart as shown in FIG. 5.

In these embodiments of the method described herein, the second step (S200b) and the third step (S300b) of the step are substantially same as the second step (i.e. S200a) and the third step (i.e. S300a) of the embodiments of the step as described above and illustrated in FIG. 2 and FIG. 3, yet a first step (i.e. S100b) thereof is different from the first step (i.e. S100a).

Specifically, in these above embodiments of the manufacturing method, the first step (i.e. S100b) comprises:

S100b: Providing a hydrophilic material; coating the hydrophilic material over a substrate 10; and drying the hydrophilic material to form a first film layer 1 comprising a hydrophilic material sub-layer 11.

As such, in this above embodiment of the method, only the hydrophilic material is employed as the material of the first film layer 1. That is, only a hydrophilic material sub-layer 11 is formed over the substrate 10. Herein, the hydrophilic material can be a photoresist, which can be coated over the substrate 10 to thereby form a hydrophilic material sub-layer 11, as shown in FIG. 6.

Because in these embodiments of the manufacturing method described herein, other steps (i.e. S200b and S300b) are substantially same as the aforementioned second and third steps S200a and S300a of the embodiments illustrated in FIG. 2 and FIG. 3 and as described above, they will not be repeated herein.

Figure 6:
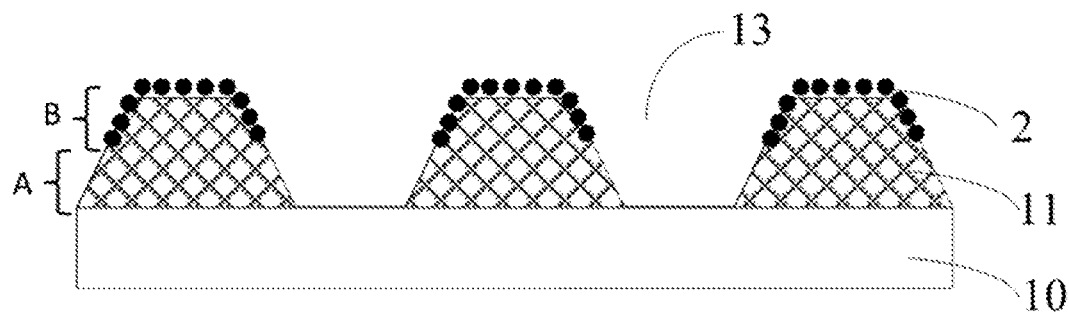
FIG. 6 is a schematic diagram of the array substrate formed utilizing the method as shown in FIG. 5.

In the array substrate manufactured thereby, which is indicated in FIG. 6, the second film layer 2 comprising a hydrophobic material, which is substantially the hydrophobic material layer, is arranged at the side wall of each accommodating well 13 of the pixel defining layer. The upper portion of the side wall is thus covered by the second film layer 2 to thereby form the overlapped region B having a hydrophobic outer surface. A lower portion of the side wall is thus an exposed region A having a hydrophilic outer surface.

Figure 7:
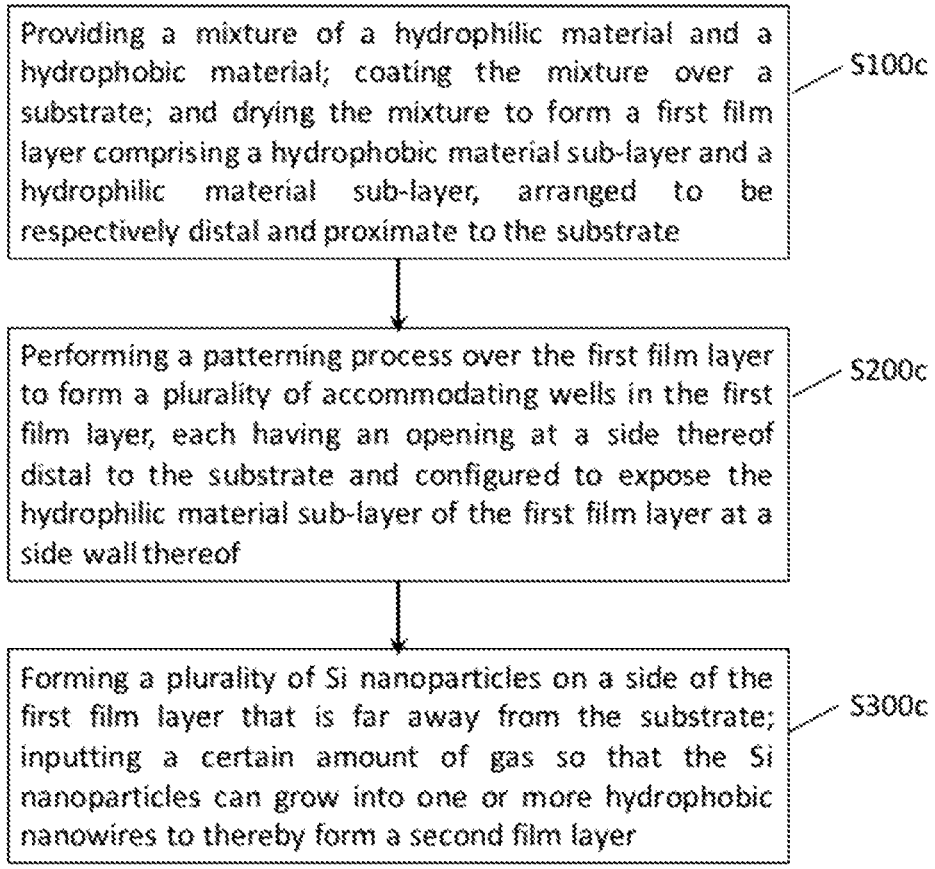
FIG. 7 is a flow chart of a method for manufacturing an array substrate according to yet another embodiment of the present disclosure.

According to yet another embodiment, the manufacturing method includes three steps S100c, S200c, and S300c, as illustrated by the flow chart as shown in FIG. 7.

The first step (S100c) and the second step (S200c) in these embodiments described above are substantially same as the first step (i.e. S100a) and the second step (i.e. S200a) of the embodiments illustrated in FIG. 2 and FIG. 3 and as described above and, yet its third step (i.e. S300c) is different from the third step (i.e. S300a).

Specifically, the third step (i.e. S300c) comprises:

S300c: Forming a plurality of Si nanoparticles on a side of the first film layer 1 that is far away from the substrate 10; inputting a certain amount of gas so that the Si nanoparticles can grow into one or more hydrophobic nanowires to thereby form a second film layer 2, as shown in FIG. 8.

Because in these embodiments of the manufacturing method described herein, other steps (i.e. S100c and S200c) are substantially same as aforementioned S100a and S200a of the embodiments illustrated in FIG. 2 and FIG. 3 and described above, they will not be repeated herein.

Figure 8:
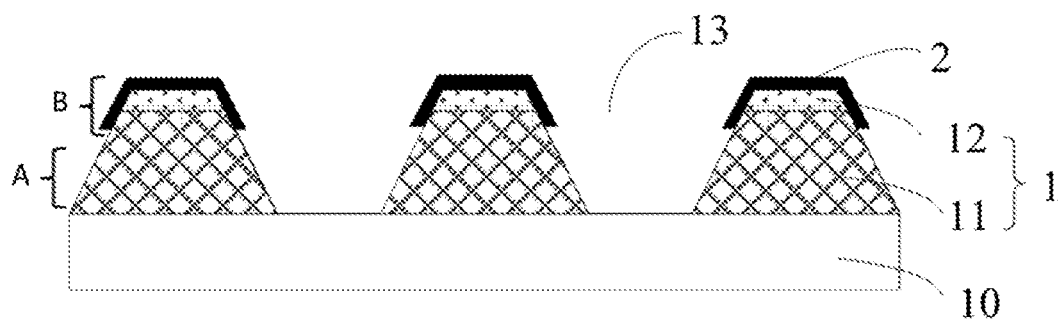
FIG. 8 is a schematic diagram of the array substrate formed utilizing the method as shown in FIG. 7.

In the array substrate manufactured thereby, which is indicated in FIG. 8, the second film layer 2 is arranged at the side wall of each accommodating well 13 of the pixel defining layer. The upper portion of the side wall is thus covered by the second film layer 2 to thereby form the overlapped region B having a hydrophobic outer surface. A lower portion of the side wall is thus an exposed region A having a hydrophilic outer surface.

It is noted that the array substrate manufacturing method may further comprise several other steps, as listed below. Specifically, prior to the forming a pixel defining layer having a plurality of accommodating wells over a substrate (i.e. S1), the method for manufacturing an array substrate can further comprise:

Forming a plurality of structural layers for a pixel driving circuit over the substrate 10;

Forming a planarization layer over the plurality of structural layers, and forming a plurality of vias in the planarization layer, each configured to electrically couple or connect the pixel driving circuit with a first electrode of an organic electroluminescent light-emitting diode; and Forming the first electrode of the organic electroluminescent light-emitting diode over the planarization layer, such that the pixel driving circuit is electrically coupled or connected with the first electrode of the organic electroluminescent light-emitting diode through each of the plurality of vias in the planarization layer.

After these above steps, the method for manufacturing an array substrate can further comprise:

Forming a pixel defining layer having a plurality of accommodating wells over the first electrode, which can be based on any one of the embodiments of the step as described above; and Forming each of a plurality of organic functional layers inside each accommodating well through a solution process.

Specifically, this last step of forming each of a plurality of organic functional layers inside each accommodating well through a solution process can include the following sub-steps:

Forming a hole injection layer, a hole transport layer, an organic electroluminescent layer, an electron transport layer, and an electron injection layer inside each of the plurality of accommodating wells through inkjet printing; and Forming a second electrode.

At this time, the method for manufacturing the array substrate having an organic electroluminescent diode is completed. Herein, the planarization layer can have a thickness of about 1 μm-10 μm.

In a second aspect, the present disclosure further provides an array substrate.

As illustrated in FIG. 3, FIG. 6, and FIG. 8, the array substrate comprises a pixel defining layer manufactured by the method according to any one of the embodiments as illustrated in the first aspect of the disclosure.

Specifically, the pixel defining layer comprises a substrate 10, a first film layer 1, and a second film layer 2. The first film layer 1 is disposed over the substrate 10, and is provided with a plurality of accommodating wells 13. Each of the plurality of accommodating wells 13 has an opening at a side of the first film layer 1 that is distal to the substrate 10, and is configured to accommodate a plurality of organic functional layers therein. Each of the plurality of accommodating wells 13 is further configured to expose the hydrophilic material sub-layer 11 of the first film layer 1 at a side wall thereof.

The first film layer 1 comprises a hydrophilic material sub-layer 11 arranged at a side thereof that is close or proximate to an upper surface of the substrate 10. The hydrophilic material sub-layer 11 is exposed at a side wall of each accommodating well 13. The second film layer 2 comprises a hydrophobic material over the first film layer 1, wherein the second film layer 2 covers an upper portion of a side wall of each of the plurality of accommodating wells 13, having a first distance between a lower edge thereof and a bottom surface of each accommodating well 13, and the second film layer 2 is configured to contact with the hydrophilic material sub-layer 11 of the first film layer 1.

Because the second film layer 2 in the pixel defining layer comprises a hydrophobic material, and is arranged over a side wall of, and thereby covers, each accommodating well 13, the second film layer 2 is in contact with the hydrophilic sub-layer 11 of the first film layer 1.

As such, when forming an organic functional layer in each accommodating well 13, although the hydrophilic material in the first film layer 1 has an attractive force to the organic functional layer, the hydrophobic material in the second film layer 2 has a repulsive force to the organic functional layer. Under the influences of the two forces, the uniformity of the organic functional layer can be improved, therefore the photochromic effect and/or the light-emitting effect of the organic electroluminescent layer can be ensured and the working life of the component can also be improved.

Herein, the first distance between a lower edge of the second film layer 2 and a bottom surface of the each of the plurality of accommodating wells 13 is about 5%-80%, preferably 10-60%, and exemplarily 10%, 15%, or 20%, of a thickness of the hydrophilic material sub-layer 11. Such a configuration is beneficial for forming the organic functional layer of different thicknesses inside each of the plurality of accommodating well 13.

The first film layer 1 may only comprise a hydrophilic material sub-layer 11 according to some embodiments of the disclosure as shown in FIG. 6. The first film layer 1 may alternatively comprise both a hydrophilic material sub-layer 11 and a hydrophobic material sub-layer 12, which are arranged to be respectively proximate and distal to the substrate 10, as illustrated in FIG. 3.

The hydrophilic material sub-layer 11 can comprise at least one of a polyimide, a bisphenol A polycarbonate, a polymer whose backbone chain contains an alkyl group, or a polymer whose backbone chain contains an annular rigid structure. The hydrophobic material sub-layer 12 can comprise at least one of polysiloxane, fluorine-containing polyolefin or fluorine-containing polyalkyleneoxide. It is noted that other compositions/materials can be respectively employed for the hydrophilic material sub-layer 11 and the hydrophobic material sub-layer 12, and there is no limitation herein.

Herein, the second film layer 2 is preferably configured not only to cover an upper portion of the side wall of each of the plurality of accommodating wells 13 to thereby contact the hydrophilic material sub-layer 11, but also to cover a side of the first film layer 1 that is far away from, or distal to, the substrate 10. In this embodiment of the array substrate disclosed herein, the side of the first film layer 1 that is far away from the substrate 10 can be regarded as a top side of the first film layer 1. This configuration allows an easy and simplified manufacturing process.

With reference to FIG. 3, FIG. 6, and FIG. 8, the second film layer 2 can comprise hydrophobic nanospheres or hydrophobic nanowires. According to some embodiments, the second film layer 2 comprises hydrophobic nanospheres, wherein a distance between neighboring nanospheres in the second film layer 2 can be between about 1-20 nm, and each nanosphere can have a size of about 20-100 nm.

The array substrate provided by this second aspect of the disclosure can be an organic electroluminescent diode (OLED) substrate, which comprises the aforementioned pixel defining layer. It further comprises a plurality of structural layers for a pixel driving circuit over the substrate 10, a first electrode of the organic electroluminescent diode (OLED) between the pixel defining layer and the plurality of structural layers for the pixel driving circuit, a plurality of organic functional layers arranged inside each accommodating well 13 (including, along a direction away from the substrate 10, a hole injection layer, a hole transport layer, an organic electroluminescent material layer, an electron transport layer, and an electron injection layer), and a second electrode arranged over the plurality of organic functional layers.

Because the array substrate (i.e. the organic electroluminescent diode substrate) disclosed herein comprises the pixel defining layer as described above, each of the plurality of organic functional layers has an improved uniformity, therefore the photochromic effect and/or the light-emitting effect of the organic electroluminescent diode is also improved.

In a third aspect, the present disclosure further provides a display apparatus.

The display apparatus comprises an array substrate according to any one of the embodiments as described above. The display apparatus can be any electronics product or component that has a display function, such as a mobile phone, a tablet, a television, a monitor, a laptop, a digital frame, or a navigator.

The display apparatus, or more specifically the organic electroluminescent diode display apparatus, can comprise other conventional structures, such as an encasing substrate that is employed to encase the array substrate, a power supply unit, or a display driving unit, etc. These conventional structures are well-known to people of skills in the field, and their description is skipped herein.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for manufacturing an array substrate, comprising:
forming a pixel defining layer having a plurality of accommodating wells over a substrate, wherein a side wall of each of the plurality of accommodating wells comprises a hydrophilic side surface; and
forming a hydrophobic material layer over the pixel defining layer, such that the hydrophilic side surface is partially covered by the hydrophobic material layer to thereby form an overlapped region having a hydrophobic outer surface and an exposed region having a hydrophilic outer surface, wherein the overlapped region is on a side of the exposed region distal to the substrate;
wherein the forming a pixel defining layer having a plurality of accommodating wells over a substrate comprises:
providing a mixture of a hydrophilic material and a hydrophobic material;
forming the mixture over the substrate;
drying the mixture to thereby form a hydrophilic material sub-layer and a hydrophobic material sub-layer, wherein the hydrophobic material sub-layer is at a side of the hydrophilic material sub-layer distal to the substrate; and
performing a patterning process to form the plurality of accommodating wells in the hydrophilic material sub-layer and the hydrophobic material sub-layer to thereby expose the hydrophilic side surface on the side wall of the each of the plurality of accommodating wells.

2. The method of claim 1, wherein in the forming a hydrophobic material layer over the pixel defining layer, a first distance of a lower edge of the hydrophobic material layer to a bottom surface of the each of the plurality of accommodating wells is smaller than a second distance of a bottom surface of the hydrophobic material sub-layer to the bottom surface of the each of the plurality of accommodating wells.

3. The method of claim 1, wherein the forming a hydrophobic material layer over the pixel defining layer comprises:
forming a plurality of Si nanoparticles over the pixel defining layer; and
allowing the plurality of Si nanoparticles to grow into a layer of hydrophobic nanowires by introducing a gas to thereby form the hydrophobic material layer over the pixel defining layer.

4. The method of claim 1, further comprising, after the forming a hydrophobic material layer over the pixel defining layer:
forming a plurality of organic functional layers inside each of the plurality of accommodating wells.

5. The method of claim 4, wherein in the forming a plurality of organic functional layers inside each of the plurality of accommodating wells, at least one of the plurality of organic functional layers is formed via a solution process.

6. The method of claim 5, wherein the solution process comprises inkjet printing.

7. A method for manufacturing an array substrate, comprising:
forming a pixel defining layer having a plurality of accommodating wells over a substrate, wherein a side wall of each of the plurality of accommodating wells comprises a hydrophilic side surface; and
forming a hydrophobic material layer over the pixel defining layer, such that the hydrophilic side surface is partially covered by the hydrophobic material layer to thereby form an overlapped region having a hydrophobic outer surface and an exposed region having a hydrophilic outer surface, wherein the overlapped region is on a side of the exposed region distal to the substrate;
wherein the forming a hydrophobic material layer over the pixel defining layer comprises:
contacting the pixel defining layer with a hydrophobic material solution, such that a side thereof having openings of the plurality of accommodating wells is submerged in the hydrophobic material solution; and
forming a layer of hydrophobic nanospheres in the hydrophobic material solution via self-assembly to thereby form the hydrophobic material layer over the pixel defining layer.

8. The method of claim 7, wherein the hydrophobic material solution comprises at least one of polysiloxane or tetrafluoroethylene.

9. An array substrate, comprising:
a substrate;
a pixel defining layer having a plurality of accommodating wells over the substrate; and
a hydrophobic material layer over the pixel defining layer;
wherein:
a side wall of each of the plurality of accommodating wells comprises a hydrophilic side surface, wherein:
the hydrophilic side surface is partially covered by the hydrophobic material layer to thereby form an overlapped region having a hydrophobic outer surface and an exposed region having a hydrophilic outer surface, wherein the overlapped region is at a side of the exposed region distal to the substrate;
the pixel defining layer comprises a hydrophilic material sub-layer and a hydrophobic material sub-layer, wherein:
the hydrophobic material sub-layer is at a side of the hydrophilic material sub-layer distal to the substrate;
the hydrophilic material sub-layer is exposed in each of the plurality of accommodating wells to thereby form the hydrophilic side surface in the side wall of the each of the plurality of accommodating wells.

10. The array substrate of claim 9, wherein a first distance of a lower edge of the hydrophobic material layer to a bottom surface of the each of the plurality of accommodating wells is about 5%-80% of a thickness of the hydrophilic material sub-layer.

11. The array substrate of claim 9, wherein the hydrophilic material sub-layer comprises at least one of a polyimide, a bisphenol A polycarbonate, a polymer whose backbone chain contains an alkyl group, or a polymer whose backbone chain contains an annular rigid structure.

12. The array substrate of claim 9, wherein the hydrophobic material sub-layer comprises at least one of polysiloxane, fluorine-containing polyolefin, or fluorine-containing polyalkyleneoxide.

13. The array substrate of claim 9, wherein the hydrophobic material layer comprises a layer of hydrophobic nanospheres.

14. The array substrate of claim 13, wherein:
each of the hydrophobic nanospheres has a size of about 20-100 nm; and
every two neighboring nanospheres have a distance of about 1-20 nm therebetween.

15. The array substrate of claim 9, wherein the hydrophobic material layer comprises a layer of hydrophobic nanowires.

16. The array substrate of claim 9, further comprising a plurality of organic functional layers disposed inside each of the plurality of accommodating wells.

17. A display apparatus, comprising an array substrate according to claim 9.

* * * * *